US010203358B2

(12) United States Patent
Katrak

(10) Patent No.: US 10,203,358 B2
(45) Date of Patent: Feb. 12, 2019

(54) SYSTEMS FOR DETERMINING A VOLTAGE OUT-OF-RANGE HIGH CONDITION AND A VOLTAGE OUT-OF-RANGE LOW CONDITION OF A BATTERY MODULE

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 177 days.

(21) Appl. No.: 15/385,242

(22) Filed: Dec. 20, 2016

(65) Prior Publication Data

US 2018/0024172 A1 Jan. 25, 2018

Related U.S. Application Data

(60) Provisional application No. 62/364,236, filed on Jul. 19, 2016.

(51) Int. Cl.

| | |
|---|---|
| ***G01R 19/00*** | (2006.01) |
| ***G01R 19/165*** | (2006.01) |
| ***G01R 31/36*** | (2006.01) |
| ***G05B 11/01*** | (2006.01) |

(52) U.S. Cl.

CPC ..... *G01R 19/1659* (2013.01); *G01R 31/3627* (2013.01); *G05B 11/01* (2013.01); *Y02T 10/7005* (2013.01)

(58) Field of Classification Search

CPC .................................................. G01R 19/1659
USPC ......................................................... 307/104
See application file for complete search history.

(56) References Cited

U.S. PATENT DOCUMENTS

| | | | | |
|---|---|---|---|---|
| 6,885,307 | B2 | 4/2005 | Lockhart et al. | |
| 8,350,529 | B2 | 1/2013 | Loncarevic | |
| 9,484,604 | B2 | 11/2016 | Schaffner et al. | |
| 2008/0164881 | A1* | 7/2008 | Miyamoto | G01R 15/04 324/429 |
| 2011/0127964 | A1* | 6/2011 | Nishida | H01M 10/44 320/118 |
| 2012/0262180 | A1* | 10/2012 | Ishishita | G01R 19/16542 324/430 |
| 2014/0266222 | A1* | 9/2014 | Baughman | H02J 7/0021 324/426 |
| 2018/0045788 | A1* | 2/2018 | Kawai | G01R 31/3651 |

* cited by examiner

*Primary Examiner* — Adi Amrany
(74) *Attorney, Agent, or Firm* — Buckert Patent & Trademark Law Firm, PC; John F. Buckert

(57) ABSTRACT

A system for determining a voltage out-of-range high condition of a battery module is provided. A microcontroller determines first, second, and third voltage values from first, second, and third voltage sensors, respectively, coupled to first, second, and third battery cells, respectively; and determines a battery module voltage value based on a fourth signal. The microcontroller sums the first, second, and third voltage values to obtain a battery module high voltage sum value. The microcontroller generates a first control signal to induce a contactor to transition to an open operational position to electrically decouple the battery module from an electrical load, if a difference between the battery module high voltage sum value and the battery module voltage value is greater than or equal to a battery module voltage out-of-range high error value.

22 Claims, 13 Drawing Sheets

200

| CELL # | CELL VOLTAGE | |
|---|---|---|
| 1 | 4.300 | 202 |
| 2 | 4.300 | 204 |
| 3 | 4.300 | 206 |
| 4 | 4.300 | 208 |
| 5 | 4.300 | 210 |
| 6 | 4.300 | 212 |
| 7 | 4.300 | 214 |
| MODULE REF. SUM | 30.100 | 216 |

| CV CELL MULTI WEIGHTING | CV DELTA SQUARE | |
|---|---|---|
| 1.0 | 0.0009 | 252 |
| 1.0 | 0.0009 | 254 |
| 1.0 | 0.0009 | 256 |
| 1.0 | 0.0009 | 258 |
| 1.0 | 0.0009 | 260 |
| 1.0 | 0.0009 | 262 |
| 1.0 | 0.0009 | 264 |
| 1.0 | 0.01 | 265 |
| SUM OF SQUARES EQUAL WEIGHTING | 0.0163 | 266 |
| SQUARE ROOT | 0.1277 | 267 |

FIG. 3

| CV CELL MULTI WEIGHTING | CV DELTA SQUARE AND WEIGHTING | |
|---|---|---|
| 2.5 | 0.00225 | 352 |
| 2.0 | 0.00180 | 354 |
| 1.5 | 0.00135 | 356 |
| 1.0 | 0.00090 | 358 |
| 1.5 | 0.00135 | 360 |
| 2.0 | 0.00180 | 362 |
| 2.5 | 0.00225 | 364 |
| 1.0 | 0.01 | 365 |
| SUM OF SQUARES MULTI-WEIGHTING | 0.0217 | 366 |
| SQUARE ROOT | 0.1473 | 367 |

| CELL # | CELL VOLTAGE |  |
|---|---|---|
| 1 | 2.500 | 502 |
| 2 | 2.500 | 504 |
| 3 | 2.500 | 506 |
| 4 | 2.500 | 508 |
| 5 | 2.500 | 510 |
| 6 | 2.500 | 512 |
| 7 | 2.500 | 514 |
| MODULE REF. SUM | 17.500 | 516 |

| CV CELL SINGLE WEIGHTING | CV DELTA SQUARE |  |
|---|---|---|
| 1.0 | 0.0025 | 552 |
| 1.0 | 0.0025 | 554 |
| 1.0 | 0.0025 | 556 |
| 1.0 | 0.0025 | 558 |
| 1.0 | 0.0025 | 560 |
| 1.0 | 0.0025 | 562 |
| 1.0 | 0.0025 | 564 |
| 1.0 | 0.01 | 565 |
| SUM OF SQUARES EQUAL WEIGHTING | 0.0275 | 566 |
| SQUARE ROOT | 0.1658 | 567 |

| CV CELL MULTI WEIGHTING | CV DELTA SQUARE AND WEIGHTING | |
|---|---|---|
| 2.5 | 0.00625 | 652 |
| 2.0 | 0.00500 | 654 |
| 1.5 | 0.00375 | 656 |
| 1.0 | 0.00250 | 658 |
| 1.5 | 0.00375 | 660 |
| 2.0 | 0.00500 | 662 |
| 2.5 | 0.00625 | 664 |
| 1.0 | 0.01 | 665 |
| SUM OF SQUARES MULTI-WEIGHTING | 0.0425 | 666 |
| SQUARE ROOT | 0.2062 | 667 |

FIG. 13

SYSTEMS FOR DETERMINING A VOLTAGE OUT-OF-RANGE HIGH CONDITION AND A VOLTAGE OUT-OF-RANGE LOW CONDITION OF A BATTERY MODULE

CROSS-REFERENCE TO RELATED APPLICATION

This application claims priority to U.S. Provisional Patent Application No. 62/364,236 filed on Jul. 19, 2016, the entire contents of which are hereby incorporated by reference herein.

BACKGROUND

The inventor herein has recognized a need for improved systems for determining a voltage out-of-range high condition and a voltage out-of-range low condition of a battery module.

SUMMARY

A system for determining a voltage out-of-range high condition of a battery module in accordance with an exemplary embodiment is provided. The battery module has at least first, second, and third battery cells. The system includes a first voltage sensor that is electrically coupled to the first battery cell. The first voltage sensor outputs a first signal indicating a first voltage level being output by the first battery cell. The system further includes a second voltage sensor that is electrically coupled to the second battery cell. The second voltage sensor outputs a second signal indicating a second voltage level being output by the second battery cell. The system further includes a third voltage sensor that is electrically coupled to the third battery cell. The third voltage sensor outputs a third signal indicating a third voltage level being output by the third battery cell. The system further includes a battery module voltage sensor that is electrically coupled to the battery module. The battery module voltage sensor outputs a fourth signal indicating a battery module voltage level being output by the battery module. The system further includes a microcontroller operably coupled to the first, second, and third voltage sensors, the battery module voltage sensor, and a memory device. The memory device has a battery module voltage out-of-range high error value corresponding to a square root of a first sum of squares value therein. The first sum of squares value corresponds to a sum of first, second, and third battery cell voltage measurement error square values and a battery module voltage measurement error square value. The microcontroller determines first, second, and third voltage values based on the first, second, and third signals, respectively. The microcontroller further determines a battery module voltage value based on the fourth signal. The microcontroller further determines if at least one of the first voltage value, the second voltage value, and the third voltage value is greater than a desired maximum cell voltage value. The microcontroller further replaces the at least one of the first voltage value, the second voltage value, and the third voltage value that is greater than the desired maximum cell voltage value with a desired cell voltage value. The desired cell voltage value is less than the desired maximum cell voltage value. The microcontroller further sums the first voltage value, the second voltage value, and the third voltage value to obtain a battery module high voltage sum value. The microcontroller further generates a first control signal to induce a contactor to transition from a closed operational position to an open operational position to electrically decouple the battery module from an electrical load, if a difference between the battery module high voltage sum value and the battery module voltage value is greater than or equal to the battery module voltage out-of-range high error value indicating the voltage out-of-range high condition.

A system for determining a voltage out-of-range high condition of a battery module in accordance with another exemplary embodiment is provided. The battery module has at least first, second, and third battery cells. The system includes a first voltage sensor that is electrically coupled to the first battery cell. The first voltage sensor outputs a first signal indicating a first voltage level being output by the first battery cell. The system further includes a second voltage sensor that is electrically coupled to the second battery cell. The second voltage sensor outputs a second signal indicating a second voltage level being output by the second battery cell. The system further includes a third voltage sensor that is electrically coupled to the third battery cell. The third voltage sensor outputs a third signal indicating a third voltage level being output by the third battery cell. The system further includes a battery module voltage sensor that is electrically coupled to the battery module. The battery module voltage sensor outputs a fourth signal indicating a battery module voltage level being output by the battery module. The system further includes a microcontroller operably coupled to the first, second, and third voltage sensors, the battery module voltage sensor, and a memory device. The memory device has a battery module voltage out-of-range high error value corresponding to a square root of a first sum of squares value therein. The first sum of squares value corresponds to a sum of first, second, and third battery cell weighted voltage measurement error square values and a battery module voltage measurement error square value. The microcontroller determines first, second, and third voltage values based on the first, second, and third signals, respectively. The microcontroller further determines a battery module voltage value based on the fourth signal. The microcontroller further determines if at least one of the first voltage value, the second voltage value, and the third voltage value is greater than a desired maximum cell voltage value. The microcontroller further replaces the at least one of the first voltage value, the second voltage value, and the third voltage value that is greater than the desired maximum cell voltage value with a desired cell voltage value. The desired cell voltage value is less than the desired maximum cell voltage value. The microcontroller further sums the first voltage value, the second voltage value, and the third voltage value to obtain a battery module high voltage sum value. The microcontroller further generates a first control signal to induce a contactor to transition from a closed operational position to an open operational position to electrically decouple the battery module from an electrical load, if a difference between the battery module high voltage sum value and the battery module voltage value is greater than or equal to the battery module voltage out-of-range high error value indicating the voltage out-of-range high condition.

A system for determining a voltage out-of-range low condition of a battery module in accordance with another exemplary embodiment is provided. The battery module has at least first, second, and third battery cells. The system includes a first voltage sensor that is electrically coupled to the first battery cell. The first voltage sensor outputs a first signal indicating a first voltage level being output by the first battery cell. The system further includes a second voltage sensor that is electrically coupled to the second battery cell. The second voltage sensor outputs a second signal indicating a second voltage level being output by the second battery cell. The system further includes a third voltage sensor that is electrically coupled to the third battery cell. The third voltage sensor outputs a third signal indicating a third voltage level being output by the third battery cell. The system further includes a battery module voltage sensor that is electrically coupled to the battery module. The battery module voltage sensor outputs a fourth signal indicating a battery module voltage level being output by the battery module. The system further includes a microcontroller operably coupled to the first, second, and third voltage sensors, the battery module voltage sensor, and a memory device. The memory device has a battery module voltage out-of-range low error value corresponding to a square root of a first sum of squares value therein. The first sum of squares value corresponds to a sum of first, second, and third battery cell voltage measurement error square values and a battery module voltage measurement error square value. The microcontroller determines first, second, and third voltage values based on the first, second, and third signals, respectively. The microcontroller further determines a battery module voltage value based on the fourth signal. The microcontroller further determines if at least one of the first voltage value, the second voltage value, and the third voltage value is less than a desired minimum cell voltage value. The microcontroller further replaces at least one of the first voltage value, the second voltage value, and the third voltage value that is less than the desired minimum cell voltage value with a desired cell voltage value. The desired cell voltage value is greater than the desired minimum cell voltage value. The microcontroller further sums the first voltage value, the second voltage value, and the third voltage value to obtain a battery module low voltage sum value. The microcontroller further generates a first control signal to induce a contactor to transition from a closed operational position to an open operational position to electrically decouple the battery module from an electrical load, if a difference between the battery module low voltage sum value and the battery module voltage value is greater than or equal to the battery module voltage out-of-range low error value indicating the voltage out-of-range low condition.

A system for determining a voltage out-of-range low condition of a battery module in accordance with another exemplary embodiment is provided. The battery module has at least first, second, and third battery cells. The system includes a first voltage sensor that is electrically coupled to the first battery cell. The first voltage sensor outputs a first signal indicating a first voltage level being output by the first battery cell. The system further includes a second voltage sensor that is electrically coupled to the second battery cell. The second voltage sensor outputs a second signal indicating a second voltage level being output by the second battery cell. The system further includes a third voltage sensor that is electrically coupled to the third battery cell. The third voltage sensor outputs a third signal indicating a third voltage level being output by the third battery cell. The system further includes a battery module voltage sensor that is electrically coupled to the battery module. The battery module voltage sensor outputs a fourth signal indicating a battery module voltage level being output by the battery module. The system further includes a microcontroller operably coupled to the first, second, and third voltage sensors, the battery module voltage sensor, and a memory device. The memory device has a battery module voltage out-of-range low error value corresponding to a square root of a first sum of squares value therein. The first sum of squares value corresponds to a sum of first, second, and third battery cell weighted voltage measurement error square values and a battery module voltage measurement error square value. The microcontroller determines first, second, and third voltage values based on the first, second, and third signals, respectively. The microcontroller further determines a battery module voltage value based on the fourth signal. The microcontroller further determines if at least one of the first voltage value, the second voltage value, and the third voltage value is less than a desired minimum cell voltage value. The microcontroller further replaces the at least one of the first voltage value, the second voltage value, and the third voltage value that is less than the desired minimum cell voltage value with a desired cell voltage value. The desired cell voltage value is greater than the desired minimum cell voltage value. The microcontroller further sums the first voltage value, the second voltage value, and the third voltage value to obtain a battery module low voltage sum value. The microcontroller further generates a first control signal to induce a contactor to transition from a closed operational position to an open operational position to electrically decouple the battery module from an electrical load, if a difference between the battery module low voltage sum value and the battery module voltage value is greater than or equal to the battery module voltage out-of-range low error value indicating the voltage out-of-range low condition

BRIEF DESCRIPTION OF THE DRAWINGS

FIG. 2 is a first table indicating battery cell values utilized by the system of FIG. 1 for determining a voltage out-of-range high condition of the battery module;

FIG. 3 is a second table indicating battery cell values utilized by the system of FIG. 1 for determining a voltage out-of-range high condition of the battery module;

FIG. 6 is a third table indicating weighted battery cell values utilized by the system of FIG. 1 for determining a voltage out-of-range high condition of the battery module;

FIG. 9 is a fourth table indicating battery cell values utilized by the system of FIG. 1 for determining a voltage out-of-range low condition of the battery module;

FIG. 10 is a fifth table indicating battery cell values utilized by the system of FIG. 1 for determining a voltage out-of-range low condition of the battery module;

FIG. 13 is a sixth table indicating weighted battery cell values utilized by the system of FIG. 1 for determining a voltage out-of-range low condition of the battery module.

DETAILED DESCRIPTION

Figure 1:
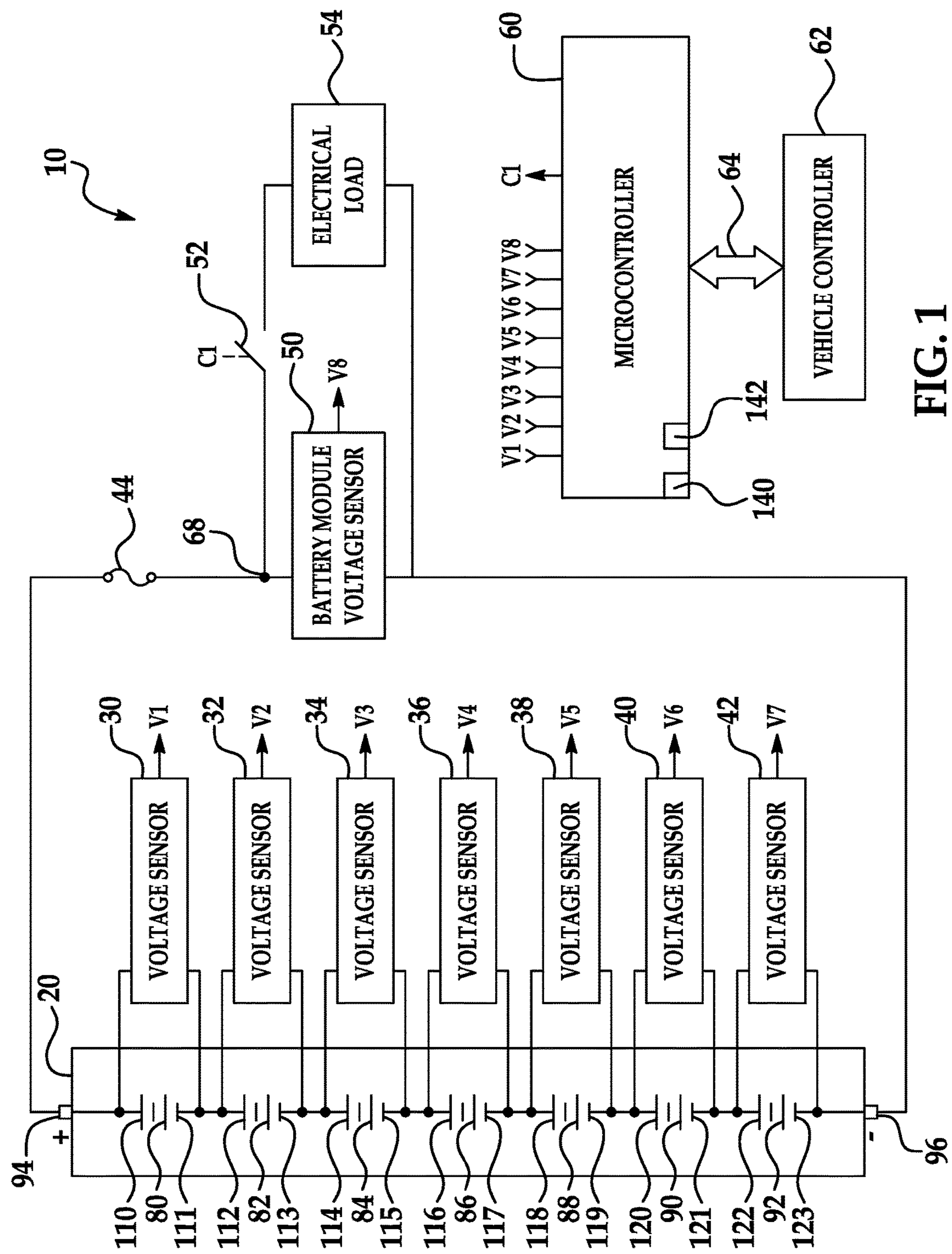
FIG. 1 is a schematic of a system for determining voltage out-of-range low conditions and voltage out-of-range high conditions of a battery module in accordance with an exemplary embodiment.
Figure 4:
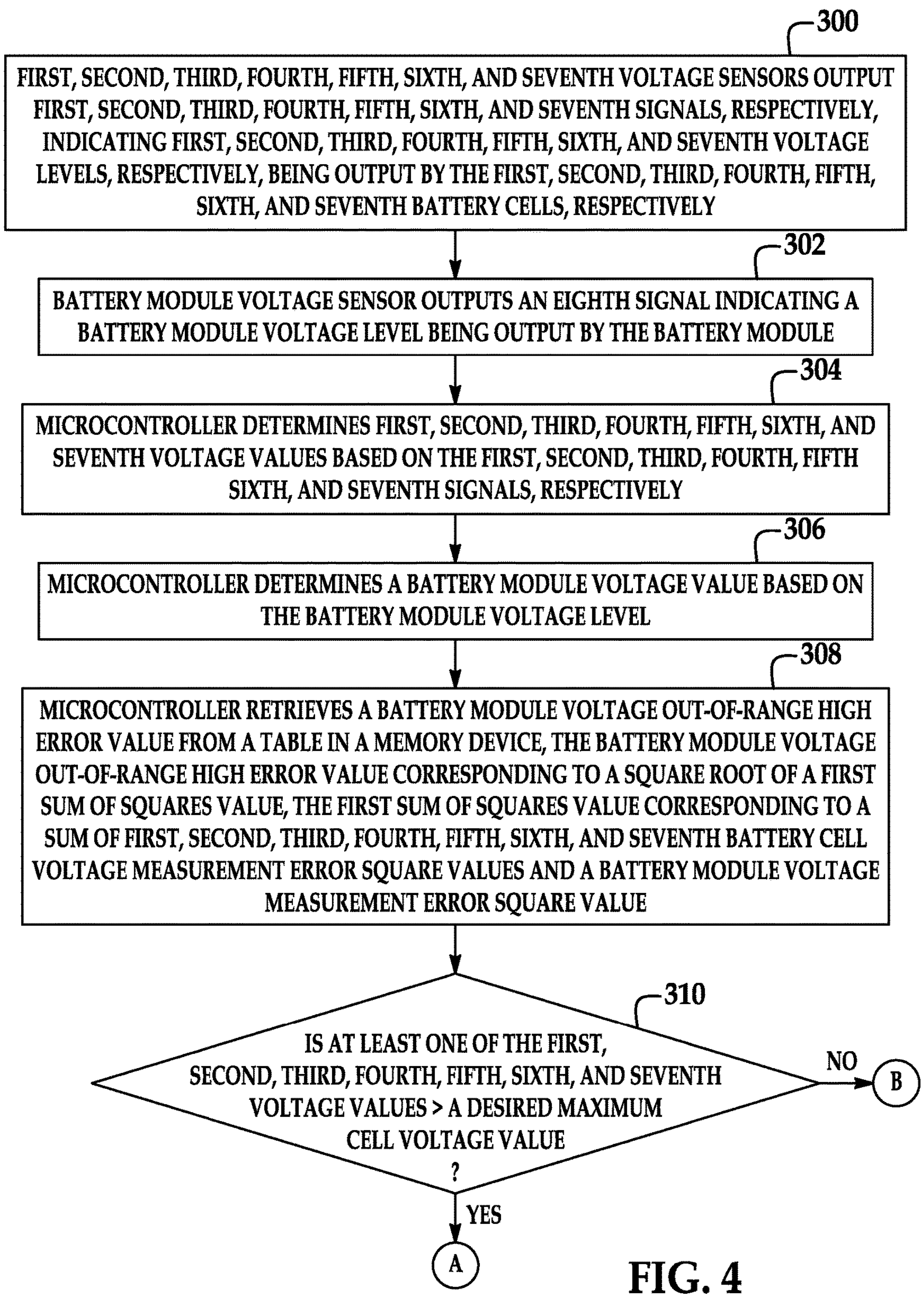
FIGS. 4-5 are flowcharts of a method for determining a voltage out-of-range high condition of a battery module utilizing the first and second tables in accordance with another exemplary embodiment.
Figure 5:
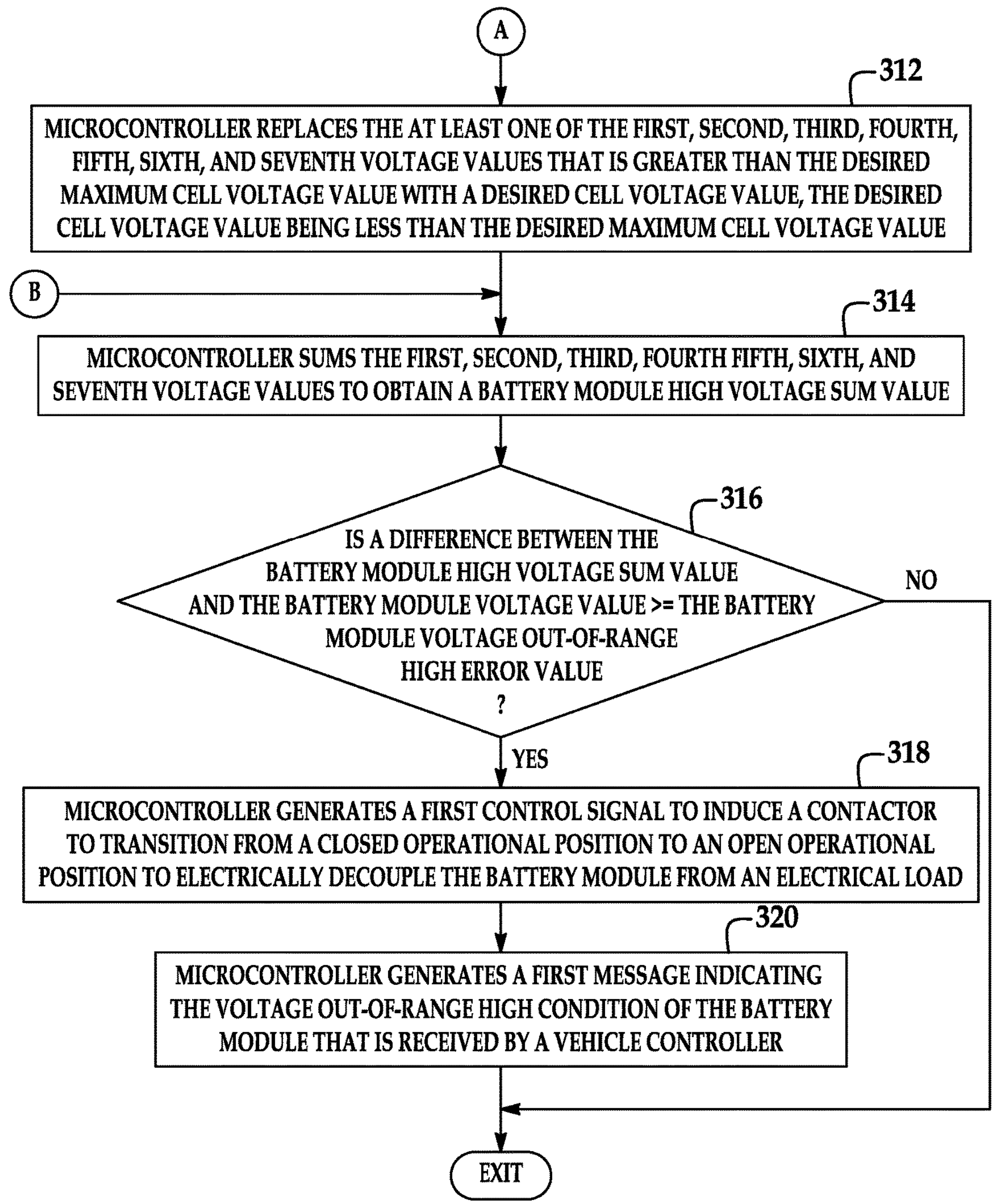
Figure 7:
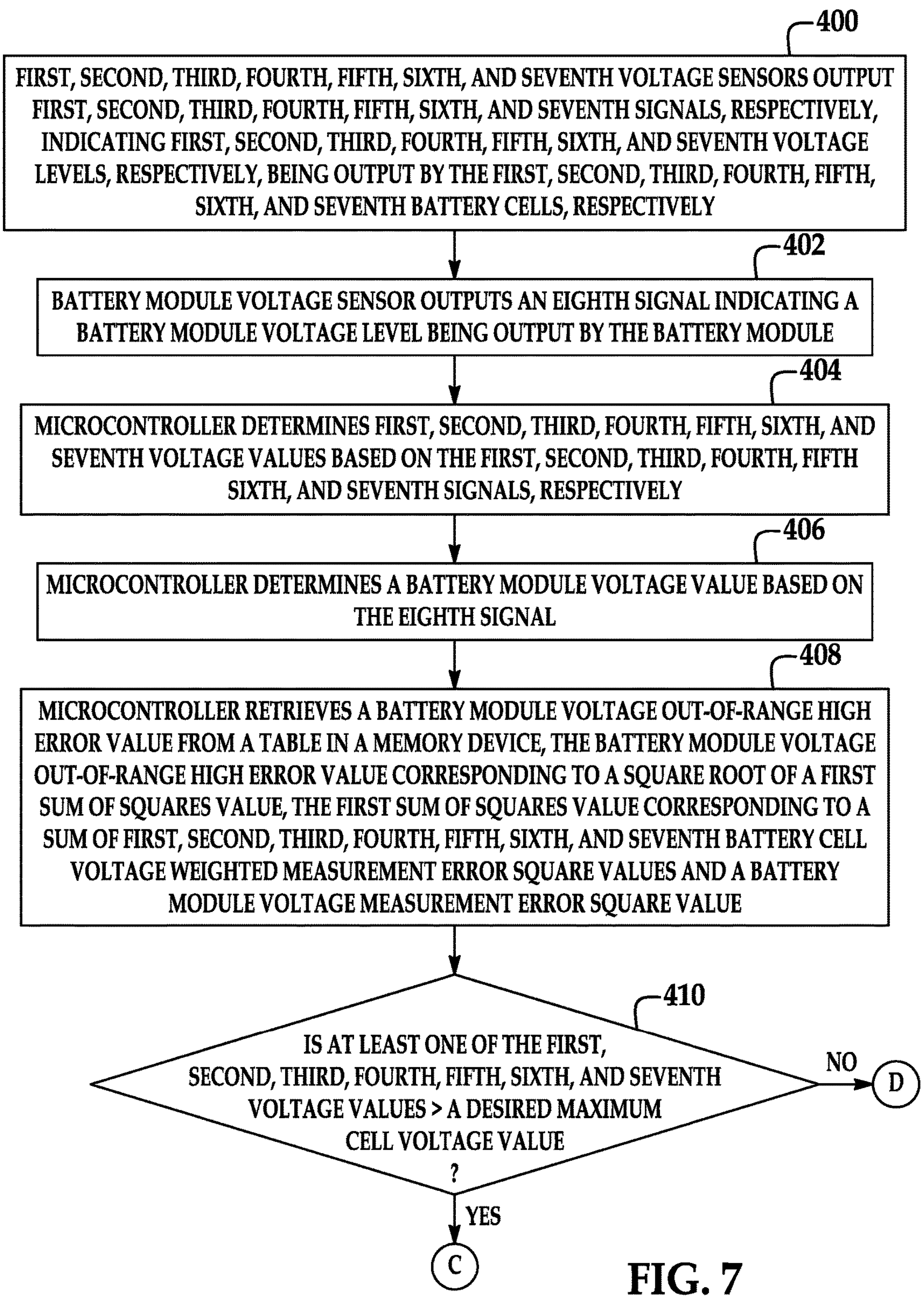
FIGS. 7-8 are flowcharts of a method for determining a voltage out-of-range high condition of a battery module utilizing the first and third tables in accordance with another exemplary embodiment.
Figure 8:
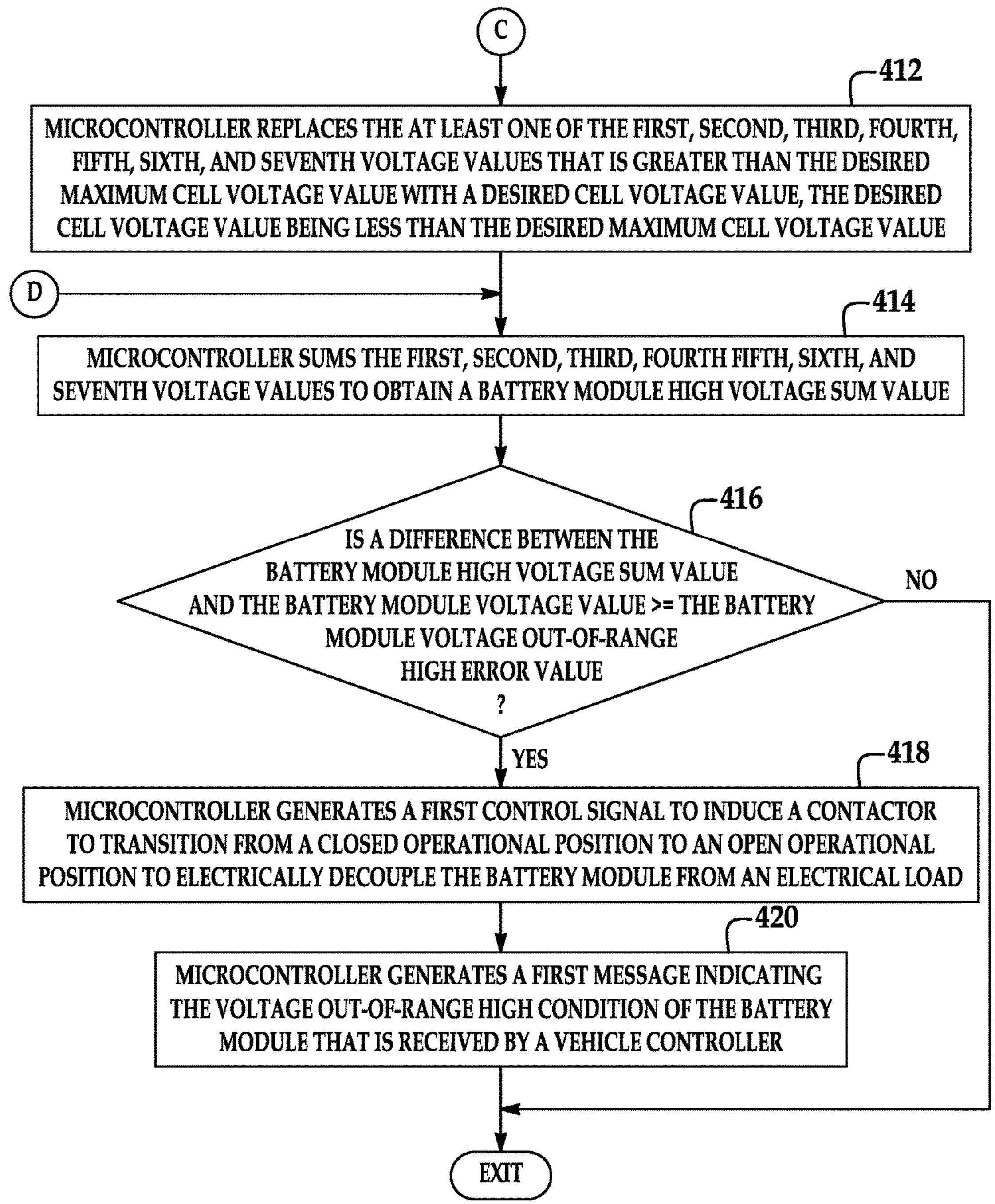
Figure 11:
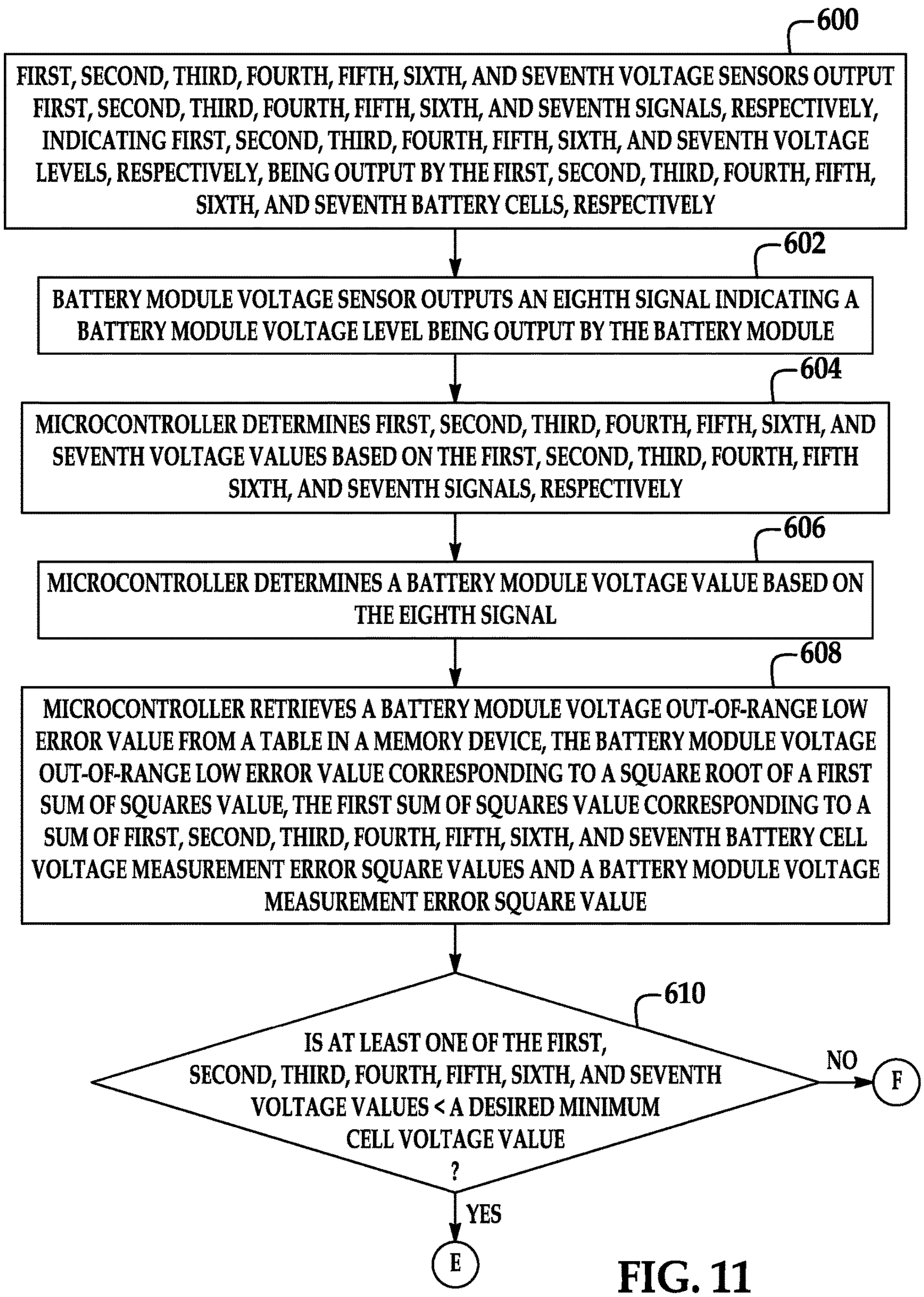
FIGS. 11-12 are flowcharts of a method for determining a voltage out-of-range low condition of a battery module utilizing the fourth and fifth tables in accordance with another exemplary embodiment.
Figure 12:
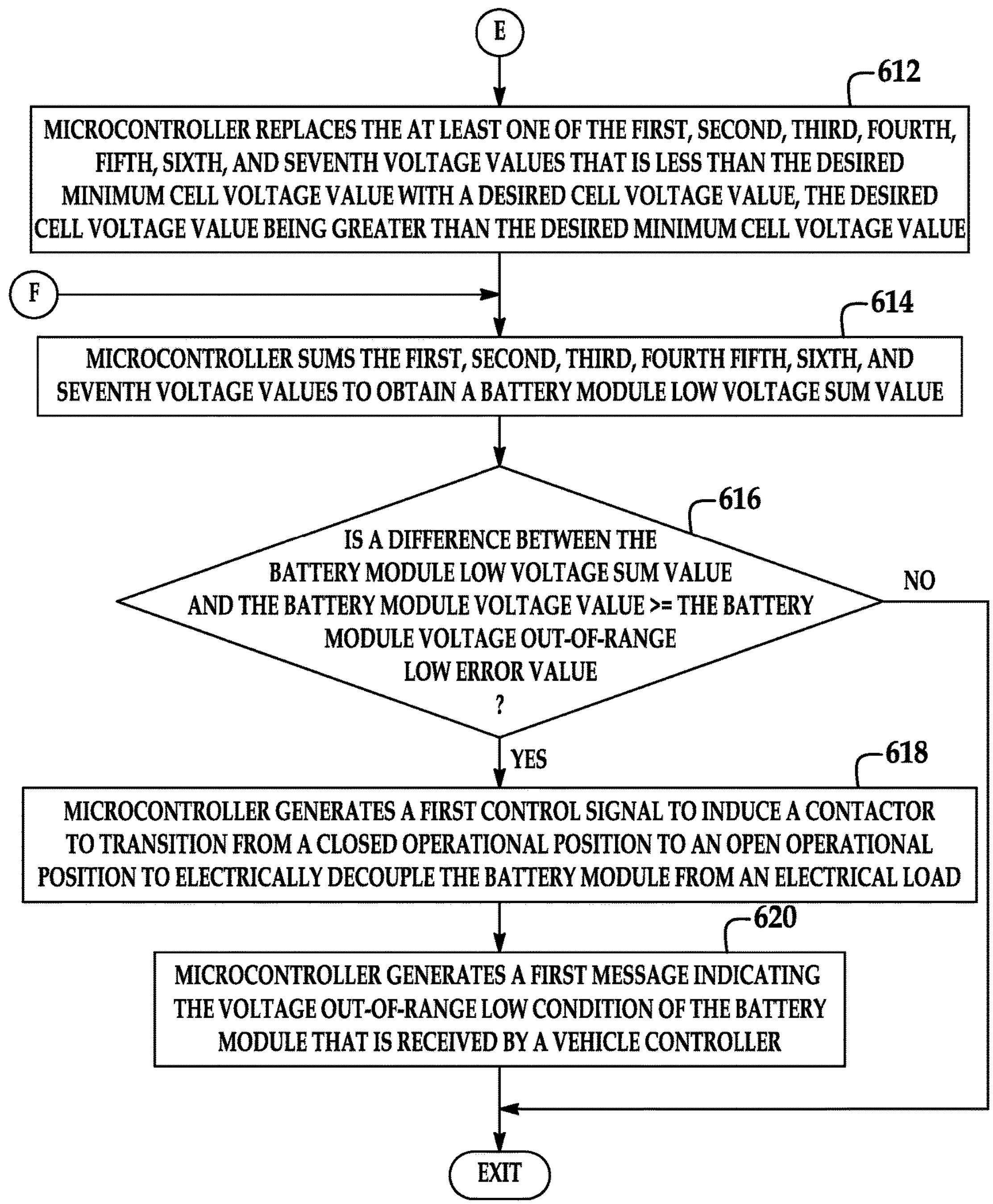
Figure 14:
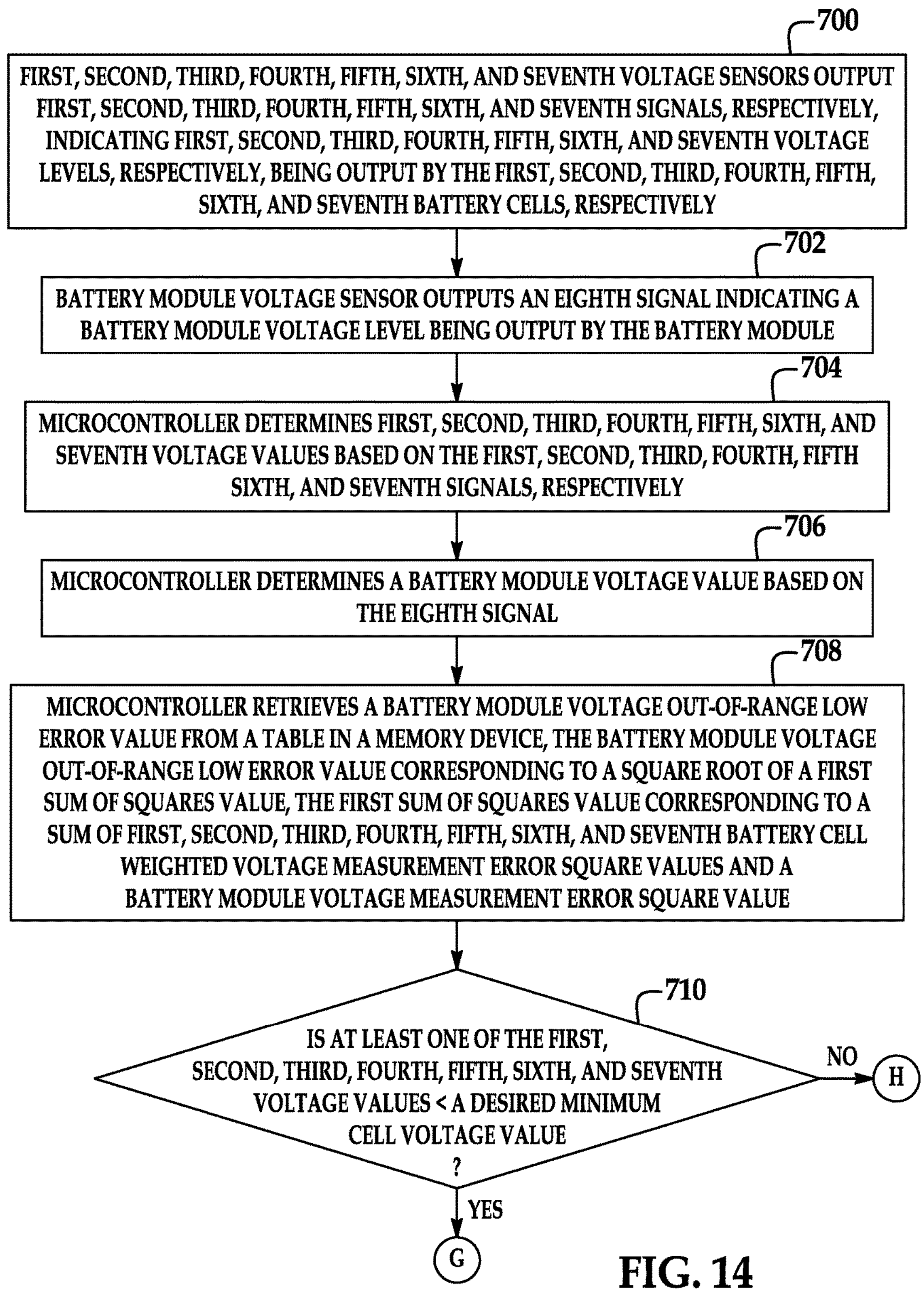
FIGS. 14-15 are flowcharts of a method for determining a voltage out-of-range low condition of a battery module utilizing the fourth and sixth tables in accordance with another exemplary embodiment.
Figure 15:
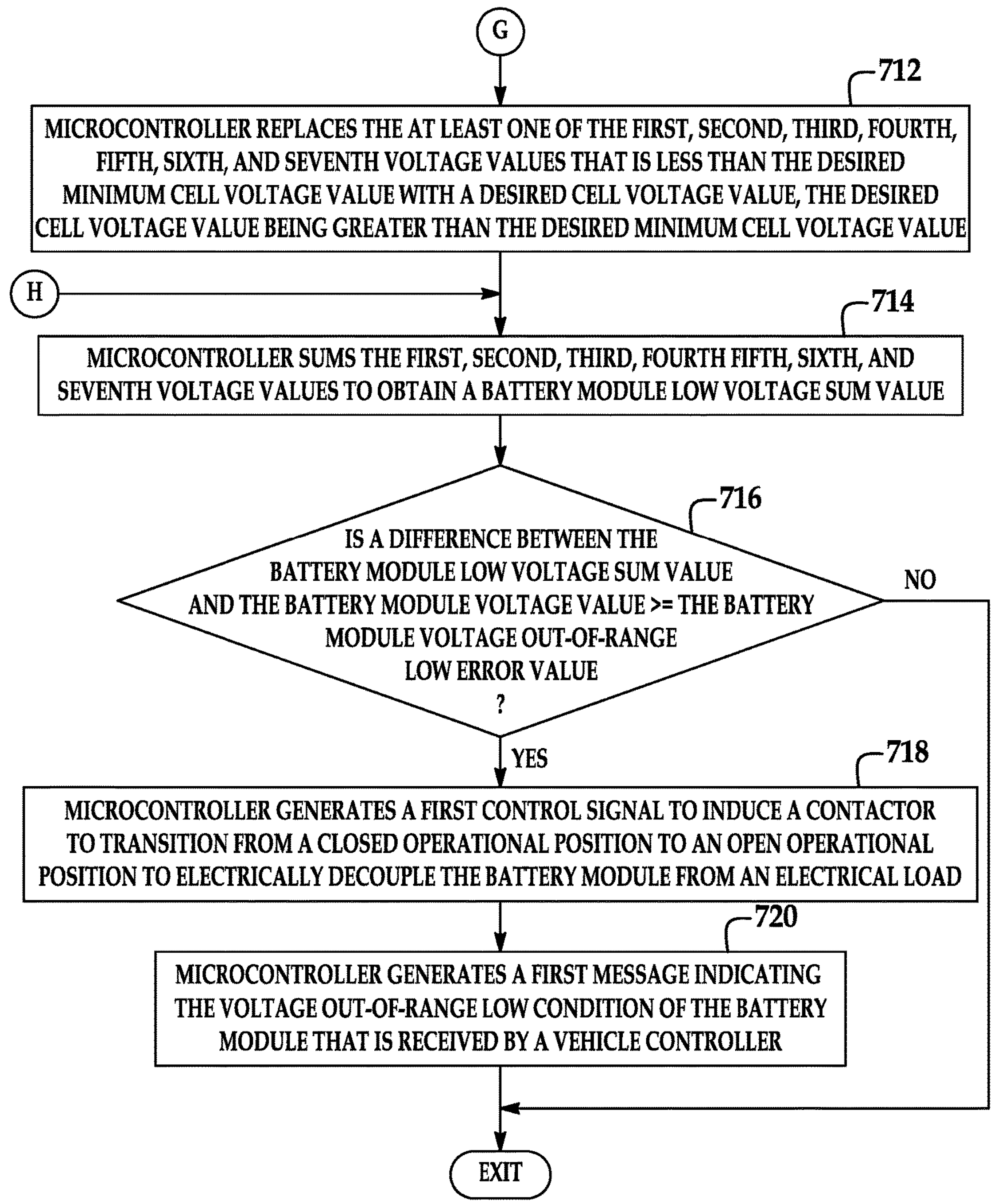

Referring to FIG. 1, a system 10 for determining voltage out-of-range conditions of a battery module 20 in accordance with an exemplary embodiment is provided. The system 10 includes voltage sensors 30, 32, 34, 36, 38, 40, 42, an electrical fuse 44, a battery module voltage sensor 50, a contactor or switch 52, an electrical load 54, a microcontroller 60, a vehicle controller 62, and a communication bus 64. An advantage of the system 10 is that the system 10 can determine a voltage out-of-range high condition of the battery module 20 utilizing a measurement error of each of the voltage sensors 30-42 and a measurement error of the battery module voltage sensor 50. Further, the system 10 can determine a voltage out-of-range low condition of the battery module 20 utilizing a measurement error of each of the voltage sensors 30-42 and the measurement error of the battery module voltage sensor 50.

The battery module 20 is provided to output a battery module voltage level (e.g., an operational voltage) to the electrical load 54. In an exemplary embodiment, the battery module 20 includes battery cells 80, 82, 84, 86, 88, 90, 92, a positive terminal 94, and a negative terminal 96. The battery cells 80, 82, 84, 86, 88, 90, 92 are electrically coupled in series with one another. The battery module 20 outputs a battery module voltage level. In an exemplary embodiment, each of the battery cells 80-92 are a pouch lithium-ion battery cell. In an alternative embodiment, the battery module 20 could have three or more battery cells.

The battery cell 80 includes a positive terminal 110 and a negative terminal 111. The positive terminal 110 is electrically coupled to the positive terminal 94 of the battery module 20. The negative terminal 111 is electrically coupled to the positive terminal 112 of the battery cell 82.

The battery cell 82 includes a positive terminal 112 and a negative terminal 113. The positive terminal 112 is electrically coupled to the negative terminal 111 of the battery cell 80. The negative terminal 113 is electrically coupled to the positive terminal 114 of the battery cell 84.

The battery cell 84 includes a positive terminal 114 and a negative terminal 115. The positive terminal 114 is electrically coupled to the negative terminal 113 of the battery cell 82. The negative terminal 115 is electrically coupled to the positive terminal 116 of the battery cell 86.

The battery cell 86 includes a positive terminal 116 and a negative terminal 117. The positive terminal 116 is electrically coupled to the negative terminal 115 of the battery cell 84. The negative terminal 117 is electrically coupled to the positive terminal 118 of the battery cell 88.

The battery cell 88 includes a positive terminal 118 and a negative terminal 119. The positive terminal 118 is electrically coupled to the negative terminal 117 of the battery cell 86. The negative terminal 119 is electrically coupled to the positive terminal 120 of the battery cell 90.

The battery cell 90 includes a positive terminal 120 and a negative terminal 121. The positive terminal 120 is electrically coupled to the negative terminal 119 of the battery cell 88. The negative terminal 121 is electrically coupled to the positive terminal 122 of the battery cell 92.

The battery cell 92 includes a positive terminal 122 and a negative terminal 123. The positive terminal 122 is electrically coupled to the negative terminal 121 of the battery cell 90. The negative terminal 123 is electrically coupled to the negative terminal 96 of the battery module 20.

The voltage sensor 30 is electrically coupled to and between the positive terminal 110 and the negative terminal 111 of the battery cell 80. The voltage sensor 30 outputs a signal (V1) indicating a voltage level that is output by the battery cell 80, that is received by the microcontroller 60.

The voltage sensor 32 is electrically coupled to and between the positive terminal 112 and the negative terminal 113 of the battery cell 82. The voltage sensor 32 outputs a signal (V2) indicating a voltage level that is output by the battery cell 82, that is received by the microcontroller 60.

The voltage sensor 34 is electrically coupled to and between the positive terminal 114 and the negative terminal 115 of the battery cell 84. The voltage sensor 34 outputs a signal (V3) indicating a voltage level that is output by the battery cell 84, that is received by the microcontroller 60.

The voltage sensor 36 is electrically coupled to and between the positive terminal 116 and the negative terminal 117 of the battery cell 86. The voltage sensor 36 outputs a signal (V4) indicating a voltage level that is output by the battery cell 86, that is received by the microcontroller 60.

The voltage sensor 38 is electrically coupled to and between the positive terminal 118 and the negative terminal 119 of the battery cell 88. The voltage sensor 38 outputs a signal (V5) indicating a voltage level that is output by the battery cell 88, that is received by the microcontroller 60.

The voltage sensor 40 is electrically coupled to and between the positive terminal 120 and the negative terminal 121 of the battery cell 90. The voltage sensor 40 outputs a signal (V6) indicating a voltage level that is output by the battery cell 90, that is received by the microcontroller 60.

The voltage sensor 42 is electrically coupled to and between the positive terminal 122 and the negative terminal 123 of the battery cell 92. The voltage sensor 42 outputs a signal (V7) indicating a voltage level that is output by the battery cell 92, that is received by the microcontroller 60.

The electrical fuse 44 is electrically coupled between the positive terminal 94 the battery module 20 and an electrical node 68. The electrical node 68 is further electrically coupled to the contactor 52 (e.g., switch) and the battery module voltage sensor 50. The electrical fuse 44 conducts electrical current from the battery module 20 through the contactor 52 (when the contactor 52 has a closed operational position) to the electrical load 54.

The battery module voltage sensor 50 is electrically coupled to the battery module 20. In particular, the battery module voltage sensor 50 is electrically coupled to the positive terminal 94 the battery module 20 via the electrical fuse 44, and to the negative terminal 96 of the battery module 20. The battery module voltage sensor 50 outputs a signal indicating the battery module voltage level being output by the battery module 20, that is received by the microcontroller 60.

The contactor 52 is electrically coupled between the electrical node 68 and the electrical load 54. When the contactor 52 receives a control signal (C1) from the microcontroller 60, the contactor 52 transitions to a closed operational position to provide an operational voltage to the electrical load 54. When the contactor 52 does not receive the control signal (C1) from the microcontroller 60, the contactor 52 transitions to an open operational position which removes the operational voltage from the electrical load 54.

The electrical load 54 is electrically coupled to and between the contactor 52 and the negative terminal 96 of the battery module 20.

The microcontroller 60 is operably coupled to the voltage sensors 30, 32, 34, 36, 38, 40, 42, the battery module voltage sensor 50, and to the communication bus 64. The microcontroller 60 includes a microprocessor 140 and a memory device 142 which is operably coupled to the microprocessor 140. The microprocessor 140 is programmed to execute software instructions stored in the memory device 142 for implementing the associated flowchart steps described herein. Further, the memory device 142 stores battery module voltage out-of-range high error values and battery module voltage out-of-range low error values therein, which will be discussed in greater detail below.

Referring to FIG. 2, the table 200 will be utilized to explain the calculation of a battery module high voltage sum value (e.g., 30.100). If a battery cell has an operational voltage range between 2.5 volts-4.3 volts and there are seven battery cells in the battery module 20 each operating at 4.3 volts, the sum of voltages (e.g., battery module high voltage sum value) is 30.100 which is shown in record 216 in the table 200. In particular, in this operational example, for the battery cells 80-92, the associated values for each of the cells are:

(i) voltage level of a battery cell=4.3 volts (ii) battery module high voltage sum value=30.100 volts, (iii) voltage measurement error value of each battery cell voltage sensor=0.03 volts As shown, the table 200 includes records 202, 204, 206, 208, 210, 212, 214 associated with the battery cells 80, 82, 84, 86, 88, 90, 92, respectively. For example, the records 202, 204, 206, 208, 210, 212, 214 each have a voltage value indicating that the voltage level of each of the battery cells 80, 82, 84, 86, 88, 90, 92 is 4.300 volts. Further, the table 200 further includes a record 216 indicating that the battery module high voltage sum value is 30.100.

Referring to FIG. 3, the table 250 will be utilized to explain the calculation of a battery module voltage out-of-range high error value (e.g., 0.1277). The table 250 assumes that the measurement error (e.g., 0.03 corresponding to 30 millivolts) of each of the voltage sensors has an equal weighting (e.g., a weighting of 1.0). The square of the measurement error of each of the voltage sensors 30-42 is (0.03*0.03=0.0009).

The table 250 includes records 252, 254, 256, 258, 260, 262, 264 associated with the battery cells 80, 82, 84, 86, 88, 90, 92, respectively. For example, the record 252 has a battery cell voltage measurement error square value of 0.0009 which is associated with the battery cell 80 and the voltage sensor 30. Similarly, the records 254, 256, 258, 260, 262, 264 each have a battery cell voltage measurement error square value of 0.0009 which are associated with the battery cells 82, 84, 86, 88, 90, 92, respectively, and the voltage sensors 32, 34, 36, 38, 40, 42, respectively.

The table 250 further includes a record 265 which has a battery module voltage measurement error square value (e.g., 0.01) associated with the battery module voltage level and the battery module voltage sensor 50.

The table 250 further includes a record 266 which has a sum of squares value (e.g., 0.0163) corresponding to a sum of the battery cell voltage measurement error square values in records 252, 254, 256, 258, 260, 262, 264 associated with the battery cells 80, 82, 84, 86, 88, 90, 92, respectively, and the battery module voltage measurement error square value (e.g., 0.01) in the record 265.

The table 250 further includes a record 267 which has the battery module voltage out-of-range high error value (e.g., 0.1277) which is the square root of the sum of squares value (e.g., 0.0163).

Referring to FIGS. 1-5, a flowchart of a method for determining a voltage out-of-range high condition of the battery module 20 in accordance with another exemplary embodiment will be explained. The method will utilize the battery module high voltage sum value (e.g., 30.100) in the table 200 and the voltage out-of-range high error value (e.g., 0.1277) in the table 250 to determine the voltage out-of-range high condition of the battery module 20. Although the exemplary method utilizes seven battery cell voltage sensors coupled to seven battery cells, in an alternative embodiment, the method could utilize three or more battery cell voltage sensors coupled to the three or more battery cells and their associated signals and values.

At step 300, the voltage sensors 30, 32, 34, 36, 38, 40, 42 output first, second, third, fourth, fifth, sixth, and seventh signals, respectively, indicating first, second, third, fourth, fifth, sixth, and seventh voltage levels, respectively, being output by the battery cells 80, 82, 84, 86, 88, 90, respectively. After step 300, the method advances to step 302.

At step 302, the battery module voltage sensor 50 outputs an eighth signal indicating a battery module voltage level being output by the battery module 20. After step 302, the method advances to step 304.

At step 304, the microcontroller 60 determines first, second, third, fourth, fifth, sixth, and seventh voltage values based on the first, second, third, fourth, fifth, sixth, and seventh signals, respectively. After step 304, the method advances to step 306.

At step 306, the microcontroller 60 determines a battery module voltage value based on the battery module voltage level. After step 306, the method advances to step 308.

At step 308, the microcontroller 60 retrieves a battery module voltage out-of-range high error value (e.g., 0.1277) from the table 250 in the memory device 142. The battery module voltage out-of-range high error value (e.g., 0.1277) corresponds to a square root of a first sum of squares value (e.g., 0.0163). The first sum of squares value corresponds to a sum of first, second, third, fourth, fifth, sixth, and seventh battery cell voltage measurement error square values and a battery module voltage measurement error square value (e.g., 0.01). After step 308, the method advances to step 310.

At step 310, the microcontroller 60 makes a determination as to whether at least one of the first, second, third, fourth, fifth, sixth, and seventh voltage values is greater than a desired maximum cell voltage value (e.g., 4.33 volts). If the value of step 310 equals "yes", the method advances to step 312. Otherwise, the method advances to step 314.

At step 312, the microcontroller 60 replaces the at least one of the first, second, third, fourth, fifth, sixth, and seventh voltage values that is greater than the desired maximum cell voltage value (e.g., 4.33 volts) with a desired cell voltage value (e.g., 4.300 volts). The desired cell voltage value is less than the desired maximum cell voltage value. After step 312, the method advances to step 314.

At step 314, the microcontroller 60 sums the first, second, third, fourth, fifth, sixth, and seventh voltage values to obtain a battery module high voltage sum value. After step 314, the method advances to step 316.

At step 316, the microcontroller 60 makes a determination as to whether a difference between the battery module high voltage sum value and the battery module voltage value is greater than or equal to the battery module voltage out-of-range high error value. If the value of step 316 equals "yes", the method advances to step 318. Otherwise, the method is exited.

At step 318, the microcontroller 60 generates a first control signal to induce the contactor 52 to transition from a closed operational position to an open operational position to electrically decouple the battery module 20 from an electrical load 54. After step 318, the method advances to step 320.

At step 320, the microcontroller 60 generates a first message indicating the voltage out-of-range high condition of the battery module 20 that is received by the vehicle controller 62. After step 320, the method is exited.

Referring to FIG. 6, the table 350 will be utilized to explain the calculation of a battery module voltage out-of-range high error value (e.g., 0.1473). The table 350 assumes that the measurement error (e.g., 0.03 corresponding to 30 millivolts) of each of the voltage sensors 30-42 can have a distinct weighting. The square of the measurement error of each of the voltage sensors is (0.03*0.03=0.0009) is multiplied by an associated weighting value to obtain a battery cell weighted voltage measurement error square value for a specific battery cell and voltage sensor.

The table 350 includes records 352, 354, 356, 358, 360, 362, 364 associated with the battery cells 80, 82, 84, 86, 88, 90, 92, respectively.

For example, the record 352 has a battery cell weighted voltage measurement error square value of 0.00225 which corresponds to the square of the measurement error (e.g., 0.0009) for the voltage sensor 30 (associated with the battery cell 80) multiplied by the weighting value of 2.5 (shown in record 352).

The record 354 has a battery cell weighted voltage measurement error square value of 0.00180 which corresponds to the square of the measurement error (e.g., 0.0009) for the voltage sensor 32 (associated with the battery cell 82) multiplied by the weighting value of 2.0 (shown in record 354).

The record 356 has a battery cell weighted voltage measurement error square value of 0.00135 which corresponds to the square of the measurement error (e.g., 0.0009) for the voltage sensor 34 (associated with the battery cell 84) multiplied by the weighting value of 1.5 (shown in record 356).

The record 358 has a battery cell weighted voltage measurement error square value of 0.00090 which corresponds to the square of the measurement error (e.g., 0.0009) for the voltage sensor 36 (associated with the battery cell 86) multiplied by the weighting value of 1.0 (shown in record 358).

The record 360 has a battery cell weighted voltage measurement error square value of 0.00135 which corresponds to the square of the measurement error (e.g., 0.0009) for the voltage sensor 38 (associated with the battery cell 88) multiplied by the weighting value of 1.5 (shown in record 360).

The record 362 has a battery cell weighted voltage measurement error square value of 0.00180 which corresponds to the square of the measurement error (e.g., 0.0009) for the voltage sensor 40 (associated with the battery cell 90) multiplied by the weighting value of 2.0 (shown in record 362).

The record 364 has a battery cell weighted voltage measurement error square value of 0.00225 which corresponds to the square of the measurement error (e.g., 0.0009) for the voltage sensor 42 (associated with the battery cell 92) multiplied by the weighting value of 2.5 (shown in record 364).

The table 350 further includes a record 365 which has a battery module voltage measurement error square value (e.g., 0.01) associated with the battery module voltage level and the battery module voltage sensor 50.

The table 350 further includes a record 366 which has a sum of squares value (e.g., 0.0217) corresponding to a sum of the battery cell weighted voltage measurement error square values in records 352, 354, 356, 358, 360, 362, 364 associated with the battery cells 80, 82, 84, 86, 88, 90, 92, respectively, and the battery module voltage measurement error square value (e.g., 0.01) in the record 365.

The table 350 further includes a record 367 which has the battery module voltage out-of-range high error value (e.g., 0.1473) which is the square root of the sum of squares value (e.g., 0.0217).

Referring to FIGS. 1, 2 and 6-8, a flowchart of a method for determining a voltage out-of-range high condition of the battery module 20 in accordance with another exemplary embodiment will be explained. The method will utilize the battery module high voltage sum value (e.g., 30.100) in table 200 and the voltage out-of-range high error value (e.g., 0.1473) in table 350 to determine the voltage out-of-range high condition of the battery module 20. Although the exemplary method utilizes seven battery cell voltage sensors coupled to seven battery cells, in an alternative embodiment, the method could utilize three or more battery cell voltage sensors coupled to the three or more battery cells and their associated signals and values.

At step 400, the voltage sensors 30, 32, 34, 36, 38, 40, 42 output first, second, third, fourth, fifth, sixth, and seventh signals, respectively, indicating first, second, third, fourth, fifth, sixth, and seventh voltage levels, respectively, being output by the battery cells 80, 82, 84, 86, 88, 90, 92, respectively. After step 400, the method advances to step 402.

At step 402, the battery module voltage sensor 50 outputs an eighth signal indicating a battery module voltage level being output by the battery module 20. After step 402, the method advances to step 404.

At step 404, the microcontroller 60 determines first, second, third, fourth, fifth, sixth, and seventh voltage values based on the first, second, third, fourth, fifth, sixth, and seventh signals, respectively. After step 404, the method advances to step 406.

At step 406, the microcontroller 60 determines a battery module voltage value based on the battery module voltage level. After step 406, the method advances to step 408.

At step 408, the microcontroller 60 retrieves a battery module voltage out-of-range high error value (e.g., 0.1473) from the table 350 in the memory device 142. The battery module voltage out-of-range high error value (e.g., 0.1473) corresponds to a square root of a first sum of squares value (e.g., 0.0217). The first sum of squares value corresponding to a sum of first, second, third, fourth, fifth, sixth, and seventh battery cell voltage weighted measurement error square values and a battery module voltage measurement error square value (e.g., 0.01). After step 408, the method advances to step 410.

At step 410, the microcontroller 60 makes a determination as to whether at least one of the first, second, third, fourth, fifth, sixth, and seventh voltage values is greater than a desired maximum cell voltage value (e.g., 4.33 volts). If the value of step 410 equals "yes", the method advances to step 412. Otherwise, the method advances to step 414.

At step 412, the microcontroller 60 replaces the at least one of the first, second, third, fourth, fifth, sixth, and seventh voltage values that is greater than the desired maximum cell voltage value (e.g., 4.33 volts) with a desired cell voltage value (e.g., 4.300 volts). The desired cell voltage value is less than the desired maximum cell voltage value. After step 412, the method advances to step 414.

At step 414, the microcontroller 60 sums the first, second, third, fourth, fifth, sixth, and seventh voltage values to obtain a battery module high voltage sum value. After step 414, the method advances to step 416.

At step 416, the microcontroller 60 makes a determination as to whether a difference between the battery module high voltage sum value and the battery module voltage value is greater than or equal to the battery module voltage out-of-range high error value. If the value of step 416 equals "yes", the method advances to step 418. Otherwise, the method is exited.

At step 418, the microcontroller 60 generates a first control signal to induce the contactor 52 to transition from a closed operational position to an open operational position to electrically decouple the battery module 20 from an electrical load 54. After step 418, the method advances to step 420.

At step 420, the microcontroller 60 generates a first message indicating the voltage out-of-range high condition of the battery module 20 that is received by the vehicle controller 62. After step 420, the method is exited.

Referring to FIG. 9, the table 500 will be utilized to explain the calculation of a battery module low voltage sum value (e.g., 17.500). If a battery cell has an operational voltage range between 2.5 volts-4.3 volts and there are seven battery cells in the battery module 20 each operating at 2.5 volts, the sum of voltages (e.g., battery module low voltage sum value) is 17.500 which is shown in record 516 in the table 500. In particular, in this operational example, for the battery cells 80-92, the associated values for each of the cells are:

(i) voltage level of a battery cell=2.5 volts (ii) battery module low voltage sum value=17.500 volts, (iii) voltage measurement error value of each battery cell voltage sensor=0.05 volts As shown, the table 500 includes records 502, 504, 506, 508, 510, 512, 514 associated with the battery cells 80, 82, 84, 86, 88, 90, 92, respectively. For example, the records 502, 504, 506, 508, 510, 512, 514 each have a voltage value indicating that the voltage level of each of the battery cells 80, 82, 84, 86, 88, 90, 92 is 2.500 volts. Further, the table 500 further includes a record 516 indicating that the battery module high voltage sum value is 17.500.

Referring to FIG. 10, the table 550 will be utilized to explain the calculation of a battery module voltage out-of-range low error value (e.g., 0.1658). The table 550 assumes that the measurement error (e.g., 0.05 corresponding to 50 millivolts) of each of the voltage sensors 30-42 has an equal weighting (e.g., a weighting of 1.0). The square of the measurement error of each of the voltage sensors 30-42 is (0.05*0.05=0.0025).

The table 550 includes records 552, 554, 556, 558, 560, 562, 564 associated with the battery cells 80, 82, 84, 86, 88, 90, 92, respectively. For example, the record 552 has a battery cell voltage measurement error square value of 0.0025 which is associated with the battery cell 80 and the voltage sensor 30. Similarly, the records 254, 256, 258, 260, 262, 264 each have a battery cell voltage measurement error square value of 0.0025 which are associated with the battery cells 82, 84, 86, 88, 90, 92, respectively, and the voltage sensors 32, 34, 36, 38, 40, 42, respectively.

The table 550 further includes a record 565 which has a battery module voltage measurement error square value (e.g., 0.01) associated with the battery module voltage level and the battery module voltage sensor 50.

The table 550 further includes a record 566 which has a sum of squares value (e.g., 0.0275) corresponding to a sum of the battery cell voltage measurement error square values in records 552, 554, 556, 558, 560, 562, 564 associated with the battery cells 80, 82, 84, 86, 88, 90, 92, respectively, and the battery module voltage measurement error square value (e.g., 0.01) in the record 565.

The table 550 further includes a record 567 which has the battery module voltage out-of-range high error value (e.g., 0.1658) which is the square root of the sum of squares value (e.g., 0.0275).

Referring to FIGS. 1 and 9-12, a flowchart of a method for determining a voltage out-of-range low condition of the battery module 20 in accordance with another exemplary embodiment will be explained. The method will utilize the battery module low voltage sum value (e.g., 17.500) in table 500 and the voltage out-of-range low error value (e.g., 0.1658) in table 550 to determine the voltage out-of-range low condition of the battery module 20. Although the exemplary method utilizes seven battery cell voltage sensors coupled to seven battery cells, in an alternative embodiment, the method could utilize three or more battery cell voltage sensors coupled to the three or more battery cells and their associated signals and values.

At step 600, the voltage sensors 30, 32, 34, 36, 38, 40, 42 output first, second, third, fourth, fifth, sixth, and seventh signals, respectively, indicating first, second, third, fourth, fifth, sixth, and seventh voltage levels, respectively, being output by the battery cells 80, 82, 84, 86, 88, 90, 92, respectively. After step 600, the method advances to step 602.

At step 602, the battery module voltage sensor 50 outputs an eighth signal indicating a battery module voltage level being output by the battery module 20. After step 602, the method advances to step 604.

At step 604, the microcontroller 60 determines first, second, third, fourth, fifth, sixth, and seventh voltage values based on the first, second, third, fourth, fifth, sixth, and seventh signals, respectively. After step 604, the method advances to step 606.

At step 606, the microcontroller 60 determines a battery module voltage value based on the battery module voltage level. After step 606, the method advances to step 608.

At step 608, the microcontroller 60 retrieves a battery module voltage out-of-range low error value (e.g., 0.1658) from the table 550 in the memory device 142. The battery module voltage out-of-range low error value corresponds to a square root of a first sum of squares value (e.g., 0.0275). The first sum of squares value corresponds to a sum of first, second, third, fourth, fifth, sixth, and seventh battery cell voltage measurement error square values and a battery module voltage measurement error square value (e.g., 0.01). After step 608, the method advances to step 610.

At step 610, the microcontroller 60 makes a determination as to whether at least one of the first, second, third, fourth, fifth, sixth, and seventh voltage values is less than a desired minimum cell voltage value. If the value of step 610 equals "yes", the method advances to step 612. Otherwise, the method advances to step 614.

At step 612, the microcontroller 60 replaces at least one of the first, second, third, fourth, fifth, sixth, and seventh voltage values that is less than the desired minimum cell voltage value (e.g., 2.450) with a desired cell voltage value (e.g., 2.500). The desired cell voltage value is greater than the desired minimum cell voltage value. After step 612, the method advances to step 614.

At step 614, the microcontroller 60 sums the first, second, third, fourth, fifth, sixth, and seventh voltage values to obtain a battery module low voltage sum value (e.g., 17.5000). After step 614, the method advances to step 616.

At step 616, the microcontroller 60 makes a determination as to whether a difference between the battery module low voltage sum value and the battery module voltage value is greater than or equal to the battery module voltage out-of-range low error value. If the value of step 616 equals "yes", the method advances to step 618. Otherwise, the method is exited.

At step 618, the microcontroller 60 generates a first control signal to induce the contactor 52 to transition from a closed operational position to an open operational position to electrically decouple the battery module 20 from the electrical load 54. After step 618, the method advances to step 620.

At step 620, the microcontroller 60 generates a first message indicating the voltage out-of-range low condition of the battery module 20 that is received by the vehicle controller 62. After step 620, the method is exited.

Referring to FIG. 13, the table 650 will be utilized to explain the calculation of a battery module voltage out-of-range low error value (e.g., 0.2062). The table 650 assumes that the measurement error (e.g., 0.05 corresponding to 50 millivolts) of each of the voltage sensors 30-42 can have a distinct weighting. The square of the measurement error of each of the voltage sensors 30-42 is (0.05*0.05=0.0025) is multiplied by an associated weighting value to obtain a battery cell weighted voltage measurement error square value for a specific battery cell and voltage sensor.

The table 650 includes records 652, 654, 656, 658, 660, 662, 664 associated with the battery cells 80, 82, 84, 86, 88, 90, 92, respectively.

For example, the record 652 has a battery cell weighted voltage measurement error square value of 0.00625 which corresponds to the square of the measurement error (e.g., 0.0025) for the voltage sensor 30 (associated with the battery cell 80) multiplied by the weighting value of 2.5 (shown in record 652).

The record 654 has a battery cell weighted voltage measurement error square value of 0.00500 which corresponds to the square of the measurement error (e.g., 0.0025) for the voltage sensor 32 (associated with the battery cell 82) multiplied by the weighting value of 2.0 (shown in record 654).

The record 656 has a battery cell weighted voltage measurement error square value of 0.00375 which corresponds to the square of the measurement error (e.g., 0.0025) for the voltage sensor 34 (associated with the battery cell 84) multiplied by the weighting value of 1.5 (shown in record 656).

The record 658 has a battery cell weighted voltage measurement error square value of 0.00250 which corresponds to the square of the measurement error (e.g., 0.0025) for the voltage sensor 36 (associated with the battery cell 86) multiplied by the weighting value of 1.0 (shown in record 658).

The record 660 has a battery cell weighted voltage measurement error square value of 0.00375 which corresponds to the square of the measurement error (e.g., 0.0025) for the voltage sensor 38 (associated with the battery cell 88) multiplied by the weighting value of 1.5 (shown in record 660).

The record 662 has a battery cell weighted voltage measurement error square value of 0.00500 which corresponds to the square of the measurement error (e.g., 0.0025) for the voltage sensor 40 (associated with the battery cell 90) multiplied by the weighting value of 2.0 (shown in record 662).

The record 664 has a battery cell weighted voltage measurement error square value of 0.00625 which corresponds to the square of the measurement error (e.g., 0.0025) for the voltage sensor 42 (associated with the battery cell 92) multiplied by the weighting value of 2.5 (shown in record 664).

The table 650 further includes a record 665 which has a battery module voltage measurement error square value (e.g., 0.01) associated with the battery module voltage level and the battery module voltage sensor 50.

The table 650 further includes a record 666 which has a sum of squares value (e.g., 0.0425) corresponding to a sum of the battery cell weighted voltage measurement error square values in records 652, 654, 656, 658, 660, 662, 664 associated with the battery cells 80, 82, 84, 86, 88, 90, 92, respectively, and the battery module voltage measurement error square value (e.g., 0.01) in the record 665.

The table 650 further includes a record 667 which has the battery module voltage out-of-range low error value (e.g., 0.2062) which is the square root of the sum of square value (e.g., 0.0425).

Referring to FIGS. 1, 9 and 13-15, a flowchart of a method for determining a voltage out-of-range low condition of the battery module 20 in accordance with another exemplary embodiment will be explained. The method will utilize the battery module low voltage sum value (e.g., 17.500) in table 500 and the voltage out-of-range low error value (e.g., 0.2062) in table 650 to determine the voltage out-of-range low condition of the battery module 20. Although the exemplary method utilizes seven battery cell voltage sensors coupled to seven battery cells, in an alternative embodiment, the method could utilize three or more battery cell voltage sensors coupled to the three or more battery cells and their associated signals and values.

At step 700, the voltage sensors 30, 32, 34, 36, 38, 40, 42 output first, second, third, fourth, fifth, sixth, and seventh signals, respectively, indicating first, second, third, fourth, fifth, sixth, and seventh voltage levels, respectively, being output by the battery cells 80, 82, 84, 86, 88, 90, 92, respectively. After step 700, the method advances to step 702.

At step 702, the battery module voltage sensor 50 outputs an eighth signal indicating a battery module voltage level being output by the battery module 20. After step 702, the method advances to step 704.

At step 704, the microcontroller 60 determines first, second, third, fourth, fifth, sixth, and seventh voltage values based on the first, second, third, fourth, fifth, sixth, and seventh signals, respectively. After step 704, the method advances to step 706.

At step 706, the microcontroller 60 determines a battery module voltage value based on the battery module voltage level. After step 706, the method advances to step 708.

At step 708, the microcontroller 60 retrieves a battery module voltage out-of-range low error value (e.g., 0.2062) from the table 650 in the memory device 142. The battery module voltage out-of-range low error value corresponds to a square root of a first sum of squares value (e.g., 0.0425). The first sum of squares value corresponds to a sum of first, second, third, fourth, fifth, sixth, and seventh battery cell weighted voltage measurement error square values and a battery module voltage measurement error square value (e.g., 0.01). After step 708, the method advances to step 710.

At step 710, the microcontroller 60 makes a determination as to whether at least one of the first, second, third, fourth, fifth, sixth, and seventh voltage values is less than a desired minimum cell voltage value. If the value of step 710 equals "yes", the method advances to step 712. Otherwise, the method advances to step 714.

At step 712, the microcontroller 60 replaces at least one of the first, second, third, fourth, fifth, sixth, and seventh voltage values that is less than the desired minimum cell voltage value (e.g., 2.450) with a desired cell voltage value (e.g., 2.500). The desired cell voltage value is greater than the desired minimum cell voltage value. After step 712, the method advances to step 714.

At step 714, the microcontroller 60 sums the first, second, third, fourth, fifth, sixth, and seventh voltage values to obtain a battery module low voltage sum value (e.g., 17.5000). After step 714, the method advances to step 716.

At step 716, the microcontroller 60 makes a determination as to whether a difference between the battery module low voltage sum value and the battery module voltage value is greater than or equal to the battery module voltage out-of-range low error value. If the value of step 716 equals "yes", the method advances to step 718. Otherwise, the method is exited.

At step 718, the microcontroller 60 generates a first control signal to induce the contactor 52 to transition from a closed operational position to an open operational position to electrically decouple the battery module 20 from the electrical load 54. After step 718, the method advances to step 720.

At step 720, the microcontroller 60 generates a first message indicating the voltage out-of-range low condition of the battery module 20 that is received by the vehicle controller 62. After step 720, the method is exited.

The systems described herein provide a substantial advantage over other systems and methods. In particular, two systems can determine a voltage out-of-range high condition of a battery module utilizing the measurement error of the battery cell voltage sensors and the measurement error of the battery module voltage sensor. Further, two systems can determine a voltage out-of-range low condition of the battery module utilizing the measurement error of the battery cell voltage sensors and the measurement error of the battery module voltage sensor.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A system for determining a voltage out-of-range high condition of a battery module; the battery module having at least first, second, and third battery cells, comprising:

a microcontroller determining first, second, and third voltage values based on first, second, and third signals, respectively, corresponding to first, second, and third voltage levels, respectively, of the first, second, and third battery cells, respectively; the microcontroller determining a battery module voltage value based on a fourth signal;

the microcontroller determining whether at least one of the first, second, and third voltage values is greater than a desired maximum cell voltage value;

the microcontroller replacing the at least one of the first, second, and third voltage values that is greater than the desired maximum cell voltage value with a desired cell voltage value, the desired cell voltage value being less than the desired maximum cell voltage value;

the microcontroller summing the first, second, and third voltage values to obtain a battery module high voltage sum value; and the microcontroller generating a first control signal to induce a contactor to transition to an open operational position to electrically decouple the battery module from an electrical load, if a difference between the battery module high voltage sum value and the battery module voltage value is greater than or equal to a battery module voltage out-of-range high error value indicating the voltage out-of-range high condition, the battery module voltage out-of-range high error value is equal to a square root of a first sum of squares value therein, the first sum of squares value is equal to a sum of first, second, and third battery cell voltage measurement error square values and a battery module voltage measurement error square value.

2. The system of claim 1, wherein the microcontroller generating a first message indicating the voltage out-of-range high condition of the battery module if the difference between the battery module high voltage sum value and the battery module voltage value is greater than or equal to the battery module voltage out-of-range high error value.

3. The system of claim 1, wherein:

the first battery cell voltage measurement error square value is ti al to a square of a measurement error associated with the first voltage level;

the second battery cell voltage measurement error square value is equal to a square of a measurement error associated with the second voltage level; and the third battery cell voltage measurement error square value is equal to a square of a measurement error associated with the third voltage level.

4. The system of claim 1, wherein the battery module voltage measurement error square value is equal to a square of a measurement error associated with the battery module voltage level.

5. The system of claim 1, further comprising:

a first voltage sensor being electrically coupled to the first battery cell, the first voltage sensor outputting the first signal indicating the first voltage level being output by the first battery cell;

a second voltage sensor being electrically coupled to the second battery cell, the second voltage sensor outputting the second signal indicating the second voltage level being output by the second battery cell;

a third voltage sensor being electrically coupled to the third battery cell, the third voltage sensor outputting the third signal indicating the third voltage level being output by the third battery cell;

a battery module voltage sensor being electrically coupled to the battery module, the battery module voltage sensor outputting the fourth signal indicating the battery module voltage level being output by the battery module; and the microcontroller operably coupled to the first, second, and third voltage sensors, the battery module voltage sensor, and a memory device; the memory device having the battery module voltage out-of-range high error value therein.

6. A system for determining a voltage out-of-range high condition of a battery module; the battery module having at least first, second, and third battery cells, comprising:

a microcontroller determining first, second, and third voltage values based on first, second, and third signals, respectively, corresponding to first, second, and third voltage levels, respectively, of the first, second, and third battery cells, respectively; the microcontroller determining a battery module voltage value based on a fourth signal;

the microcontroller determining whether at least one of the first, second, and third voltage values is greater than a desired maximum cell voltage value;

the microcontroller replacing the at least one of the first, second, and third voltage values that is greater than the desired maximum cell voltage value with a desired cell voltage value, the desired cell voltage value being less than the desired maximum cell voltage value;

the microcontroller summing the first, second, and third voltage values to obtain a battery module high voltage sum value; and the microcontroller generating a first control signal to induce a contactor to transition to an open operational position to electrically decouple the battery module from an electrical load, if a difference between the battery module high voltage sum value and the battery module voltage value is greater than or equal to a battery module voltage out-of-range high error value indicating the voltage out-of-range high condition, the battery module voltage out-of-range high error value is equal to a square root of a first sum of squares value therein, the first sum of squares value is equal to a sum of first, second, and third battery cell weighted voltage measurement error square values and a battery module voltage measurement error square value.

7. The system of claim 6, wherein the microcontroller generating a first message indicating the voltage out-of-range high condition of the battery module if the difference between the battery module high voltage sum value and the battery module voltage value is greater than or equal to the battery module voltage out-of-range high error value.

8. The system of claim 6, wherein the first battery cell weighted voltage measurement error square value is not equal to the second and third battery cell weighted voltage measurement error square values; and the second battery cell weighted voltage measurement error square value is not equal to the first and third battery cell weighted voltage measurement error square values.

9. The system of claim 6, wherein:

the first battery cell weighted voltage measurement error square value is equal to a square of a weighted measurement error associated with the first voltage level;

the second battery cell weighted voltage measurement error square value is equal to a square of a weighted measurement error associated with the second voltage level; and the third battery cell weighted voltage measurement error square value is equal to a square of a weighted measurement error associated with the third voltage level.

10. The system of claim 6, wherein the battery module voltage measurement error square value is equal to a square of a measurement error associated with the battery module voltage level.

11. The system of claim 6, further comprising:

a first voltage sensor being electrically coupled to the first battery cell, the first voltage sensor outputting the first signal indicating the first voltage level being output by the first battery cell;

a second voltage sensor being electrically coupled to the second battery cell, the second voltage sensor outputting the second signal indicating the second voltage level being output by the second battery cell;

a third voltage sensor being electrically coupled to the third battery cell, the third voltage sensor outputting the third signal indicating the third voltage level being output by the third battery cell;

a battery module voltage sensor being electrically coupled to the battery module, the battery module voltage sensor outputting the fourth signal indicating the battery module voltage level being output by the battery module; and the microcontroller operably coupled to the first, second, and third voltage sensors, the battery module voltage sensor, and a memory device; the memory device having the battery module voltage out-of-range high error value therein.

12. A system for determining a voltage out-of-range low condition of a battery module; the battery module having at least first, second, and third battery cells, comprising:

a microcontroller determining first, second, and third voltage values based on first, second, and third signals, respectively, corresponding to first, second, and third voltage levels, respectively, of the first, second, and third battery cells, respectively; the microcontroller determining a battery module voltage value based on a fourth signal;

the microcontroller determining whether at least one of the first, second, and third voltage values is less than a desired minimum cell voltage value;

the microcontroller replacing at least one of the first, second, and third voltage values that is less than the desired minimum cell voltage value with a desired cell voltage value, the desired cell voltage value being greater than the desired minimum cell voltage value;

the microcontroller summing the first, second, and third voltage values to obtain a battery module low voltage sum value; and the microcontroller generating a first control signal to induce a contactor to transition to an open operational position to electrically decouple the battery module from an electrical load, if a difference between the battery module low voltage sum value and the battery module voltage value is greater than or equal to a battery module voltage out-of-range low error value indicating the voltage out-of-range low condition, the battery module voltage out-of-range low error value is equal to a square root of a first sum of squares value therein, the first sum of squares value is equal to a sum of first, second, and third battery cell voltage measurement error square values and a battery module voltage measurement error square value.

13. The system of claim 12, wherein the microcontroller generating a first message indicating the voltage out-of-range low condition of the battery module if the difference between the battery module low voltage sum value and the battery module voltage value is greater than or equal to the battery module voltage out-of-range low error value indicating the voltage out-of-range low condition.

14. The system of claim 12, wherein:

the first battery cell voltage measurement error square value is equal to a square of a voltage measurement error associated with the first voltage level;

the second battery cell voltage measurement error square value is equal to a square of a measurement error associated with the second voltage level; and the third battery cell voltage measurement error square value is equal to a square of a measurement error associated with the third voltage level.

15. The system of claim 12, wherein the battery module voltage measurement error square value is equal to a square of a measurement error associated with the battery module voltage level.

16. A system for determining a voltage out-of-range low condition of a battery module; the battery module having at least first, second, and third battery cells, comprising:

a microcontroller determining first, second, and third voltage values based on first, second, and third signals, respectively, corresponding to first, second, and third voltage levels, respectively, of the first, second, and third battery cells, respectively; the microcontroller further determining a battery module voltage value based on a fourth signal;

the microcontroller determining whether at least one of the first, second, and third voltage values is less than a desired minimum cell voltage value;

the microcontroller replacing the at least one of the first, second, and third voltage values that is less than the desired minimum cell voltage value with a desired cell voltage value, the desired cell voltage value being greater than the desired minimum cell voltage value;

the microcontroller summing the first, second, and third voltage values to obtain a battery module low voltage sum value; and the microcontroller generating a first control signal to induce a contactor to transition to an open operational position to electrically decouple the battery module from an electrical load, if a difference between the battery module low voltage sum value and the battery module voltage value is greater than or equal to the battery module voltage out-of-range low error value indicating the voltage out-of-range low condition, the battery module voltage out-of-range low error value is equal to a square root of a first sum of squares value therein, the first sum of squares value is equal to a sum of first, second, and third battery cell weighted voltage measurement error square values and a battery module voltage measurement error square value.

17. The system of claim 12, further comprising:

a first voltage sensor being electrically coupled to the first battery cell, the first voltage sensor outputting the first signal indicating the first voltage level being output by the first battery cell;

a second voltage sensor being electrically coupled to the second battery cell, the second voltage sensor outputting the second signal indicating the second voltage level being output by the second battery cell;

a third voltage sensor being electrically coupled to the third battery cell, the third voltage sensor outputting the third signal indicating the third voltage level being output by the third battery cell;

a battery module voltage sensor being electrically coupled to the battery module, the battery module voltage sensor outputting the fourth signal indicating the battery module voltage level being output by the battery module; and the microcontroller operably coupled to the first, second, and third voltage sensors, the battery module voltage sensor, and a memory device; the memory device having the battery module voltage out-of-range low error value therein.

18. The system of claim 16, wherein the microcontroller generating a first message indicating the voltage out-of-range low condition of the battery module if the difference between the battery module low voltage sum value and the battery module voltage value is greater than or equal to the battery module voltage out-of-range low error value indicating the voltage out-of-range low condition.

19. The system of claim 16, wherein the first battery cell weighted voltage measurement error square value is not equal to the second and third battery cell weighted voltage measurement error square values; and the second battery cell weighted voltage measurement error square value is not equal to the first and third battery cell weighted voltage measurement error square values.

20. The system of claim 16, wherein:

the first battery cell weighted voltage measurement error square value is equal to a square of a weighted measurement error associated with the first voltage level;

the second battery cell weighted voltage measurement error square value is equal to a square of a weighted measurement error associated with the second voltage level; and the third battery cell weighted voltage measurement error square value is equal to a square of a weighted measurement error associated with the third voltage level.

21. The system of claim 16, wherein the battery module voltage measurement error square value is equal to a square of a measurement error associated with the battery module voltage level.

22. The system of claim 16, further comprising:

a first voltage sensor being electrically coupled to the first battery cell, the first voltage sensor outputting the first signal indicating the first voltage level being output by the first battery cell;

a second voltage sensor being electrically coupled to the second battery cell, the second voltage sensor outputting the second signal indicating the second voltage level being output by the second battery cell;

a third voltage sensor being electrically coupled to the third battery cell, the third voltage sensor outputting the third signal indicating the third voltage level being output by the third battery cell;

a battery module voltage sensor being electrically coupled to the battery module, the battery module voltage sensor outputting the fourth signal indicating the battery module voltage level being output by the battery module; and the microcontroller operably coupled to the first, second, and third voltage sensors, the battery module voltage sensor, and a memory device; the memory device having the battery module voltage out-of-range low error value therein.

* * * * *